United States Patent
Fabry et al.

(10) Patent No.: US 6,416,393 B2
(45) Date of Patent: Jul. 9, 2002

(54) PROCESS FOR PRODUCING A SEMICONDUCTOR WAFER

(75) Inventors: Laszlo Fabry, Burghausen; Gabriele Lechner, Marktl; Anton Schnegg, Burghausen; Andreas Ehlert, Mehring, all of (DE)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 0 days.

(21) Appl. No.: 09/824,394

(22) Filed: Apr. 2, 2001

(30) Foreign Application Priority Data

Apr. 13, 2000 (DE) .......................................... 100 18 338

(51) Int. Cl.$^7$ ................................................ B24B 7/19
(52) U.S. Cl. .......................... 451/41; 451/36; 451/262; 438/692
(58) Field of Search .............................. 451/41, 36, 53, 451/59, 63, 262, 268, 269, 285, 287, 288; 438/692, 693, 691

(56) References Cited

U.S. PATENT DOCUMENTS

| | | | |
|---|---|---|---|
| 3,691,694 A | | 9/1972 | Goetz et al. |
| 4,258,508 A | | 3/1981 | Wilson et al. |
| 4,968,381 A | | 11/1990 | Prigge et al. |
| 5,049,200 A | * | 9/1991 | Brunner et al. ................. 134/2 |
| 5,628,862 A | | 5/1997 | Yu et al. |
| 5,990,012 A | | 11/1999 | Robinson et al. |
| 6,089,959 A | * | 7/2000 | Nagahashi ................... 451/262 |
| 6,248,704 B1 | * | 6/2001 | Small et al. ................. 510/176 |
| 6,258,721 B1 | * | 7/2001 | Li et al. ....................... 438/693 |
| 6,274,059 B1 | * | 8/2001 | Krusell et al. ................ 216/88 |

FOREIGN PATENT DOCUMENTS

| | | |
|---|---|---|
| EP | 0 208 315 | 9/1990 |
| JP | 11-156706 | 6/1999 |

OTHER PUBLICATIONS

English Derwent Abstract AN 1987–008979 [02] corresponding to EP0208315.
English Patent Abstract of Japan corresponding to JP11–156706.

* cited by examiner

*Primary Examiner*—E. Morgan
(74) *Attorney, Agent, or Firm*—Collard & Roe, P.C.

(57) ABSTRACT

A process is for producing a semiconductor wafer with a front surface and a back surface, in which the semiconductor wafer is subjected to two-sided polishing. The process includes the following: (a) producing a hydrophobic surface on the semiconductor wafer by treating the semiconductor wafer with an aqueous HF solution; (b) simultaneous polishing of the front surface and the back surface of the semiconductor wafer with a surface which has been rendered hydrophobic, with an alkaline polishing abrasive being continuously supplied between two rotating upper and lower polishing plates, which are both covered with a polishing cloth, the pH of the polishing abrasive being from pH 8.5 to pH 12.5; (c) after an intended polishing abrasion has been reached, supplying a stopping agent to the semiconductor wafer; and (d) removing the semiconductor wafer from the polishing plates. There is also a carrier for the double-side polishing of at least one semiconductor wafer, having a cutout for holding the semiconductor wafer which is lined with a shaped part made from plastic. The shaped part is constructed in such a manner that it divides a free space between an edge of the semiconductor wafer and the carrier into a plurality of separate empty spaces.

9 Claims, 2 Drawing Sheets

PROCESS FOR PRODUCING A SEMICONDUCTOR WAFER

BACKGROUND OF THE INVENTION

1. Field of the Invention

The present invention relates to a process for producing a semiconductor wafer with a front surface and a back surface, in which the semiconductor wafer is subjected to two-sided polishing.

2. The Prior Art

A device which is suitable for the double-side polishing of semiconductor wafers is described, for example, in U.S. Pat. No. 3,691,694. According to one embodiment of double-sided polishing which is described in EP 208 315 B1, semiconductor wafers are polished in carriers made from metal, which have suitably dimensioned, plastic-lined cutouts, between two rotating polishing plates, which are each covered with a polishing cloth.

Polishing of this type often leaves behind scratches and punctiform elevations, which are visible at a resolution of a few $\mu$m, in the region of the edge of the semiconductor wafer.

SUMMARY OF THE INVENTION

It is an object of the present invention to provide a process for double-sided polishing of semiconductor wafers in which no such irregularities are formed in the region of the wafer edge.

The above object is achieved by the invention which relates to a process for producing a semiconductor wafer with a front surface and a back surface, in which the semiconductor wafer is subjected to two-sided polishing, which comprises the following temporal sequence of steps:

(a) producing a hydrophobic surface on the semiconductor wafer by treating the semiconductor wafer with an aqueous HF solution;

(b) simultaneous polishing of the front surface and the back surface of the semiconductor wafer with a surface which has been rendered hydrophobic, with an alkaline polishing abrasive being continuously supplied between two rotating upper and lower polishing plates, which are both covered with a polishing cloth, the pH of the polishing abrasive being from pH 8.5 to pH 12.5;

(c) after an intended polishing abrasion has been reached, supplying a stopping agent to the semiconductor wafer; and (d) removing the semiconductor wafer from the polishing plates.

An essential feature of the invention is that the double-side polishing in accordance with step (b) is carried out with a semiconductor wafer which immediately beforehand has been treated with an aqueous HF solution and has thus acquired a hydrophobic surface. In this way, the surface of the semiconductor wafer remains hydrophobic from the start of polishing through to the end of polishing. It has been found that a surface condition of this nature is required, since this ensures that the formation of hydrogen bubbles, which inevitably occurs during the polishing, is restricted and that the bubbles adhere less strongly to the edge of the semiconductor wafer. It is assumed to be hydrogen bubbles which adhere to the surface of the edge of the semiconductor wafer which prevent uniform etching removal and are responsible for the occurrence of the abovementioned defects in the region of the edge of the semiconductor wafer.

The treatment with aqueous HF solution preferably takes place in a bath into which the semiconductor wafer is dipped on its own or together with other semiconductor wafers. Furthermore, it is also possible to spray the semiconductor wafer with the HF solution or to expose the semiconductor wafer to a moist HF atmosphere for a certain time. The desired hydrophobicity is best achieved with an HF concentration of from 0.1% to 0.5% by weight.

Furthermore, in order to achieve the above object, the result of polishing can be optimized if certain preferred conditions are observed during the polishing itself. Some of these conditions relate to apparatus features and some to process parameters. The apparatus features are explained in more detail below with reference to figures.

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawings, wherein similar reference characters denote similar elements throughout the several views.

DETAILED DESCRIPTION OF PREFERRED EMBODIMENTS

Figure 1:
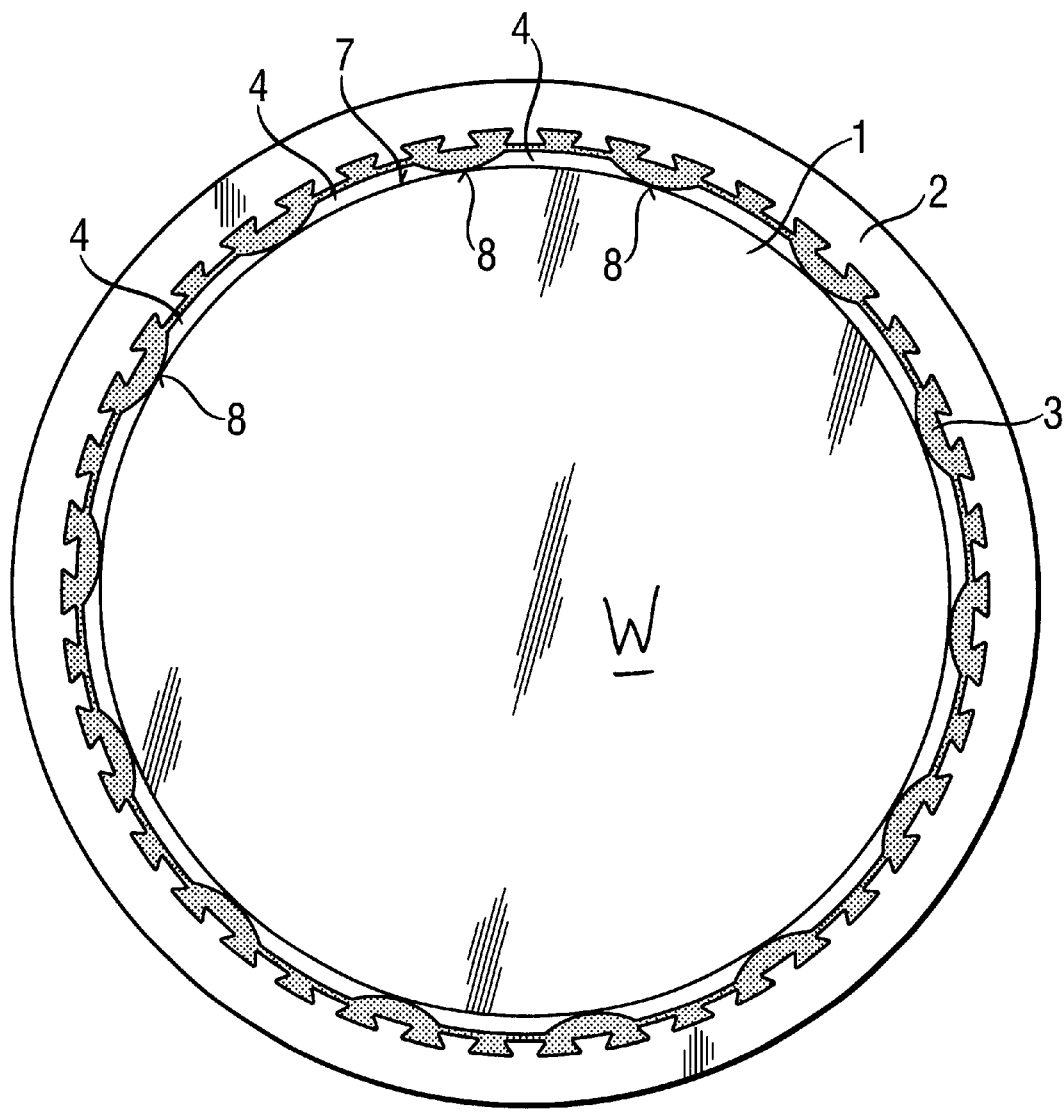
FIG. 1 shows part of a carrier, the cutout in which is lined with a shaped part according to the invention made from plastic.

According to a preferred embodiment of the invention, which is shown in FIG. 1, the semiconductor wafer W, for the double-side polishing, is to be laid in a cutout 1 in a carrier 2, which is lined with a shaped part 3 made from plastic. The shaped part is designed in such a manner that it divides a free space between the edge 7 of the semiconductor wafer W and the carrier 2 into a plurality of separate empty spaces 4. The shaped part 3 is preferably to be provided with rounded teeth 8 which face the semiconductor wafer W, the spaces between the teeth forming the empty spaces 4. During the polishing, the carrier 2 and therefore also the shaped part 3 rotate. The teeth 8 bring about constant, intensive, intimate mixing of the liquid polishing auxiliaries (polishing abrasive and stopping agent), which fill the empty spaces 4. It is in this case scarcely possible for hydrogen bubbles to stick to the edge of the semiconductor wafer for a prolonged period and thus to mask this edge.

Figure 2:
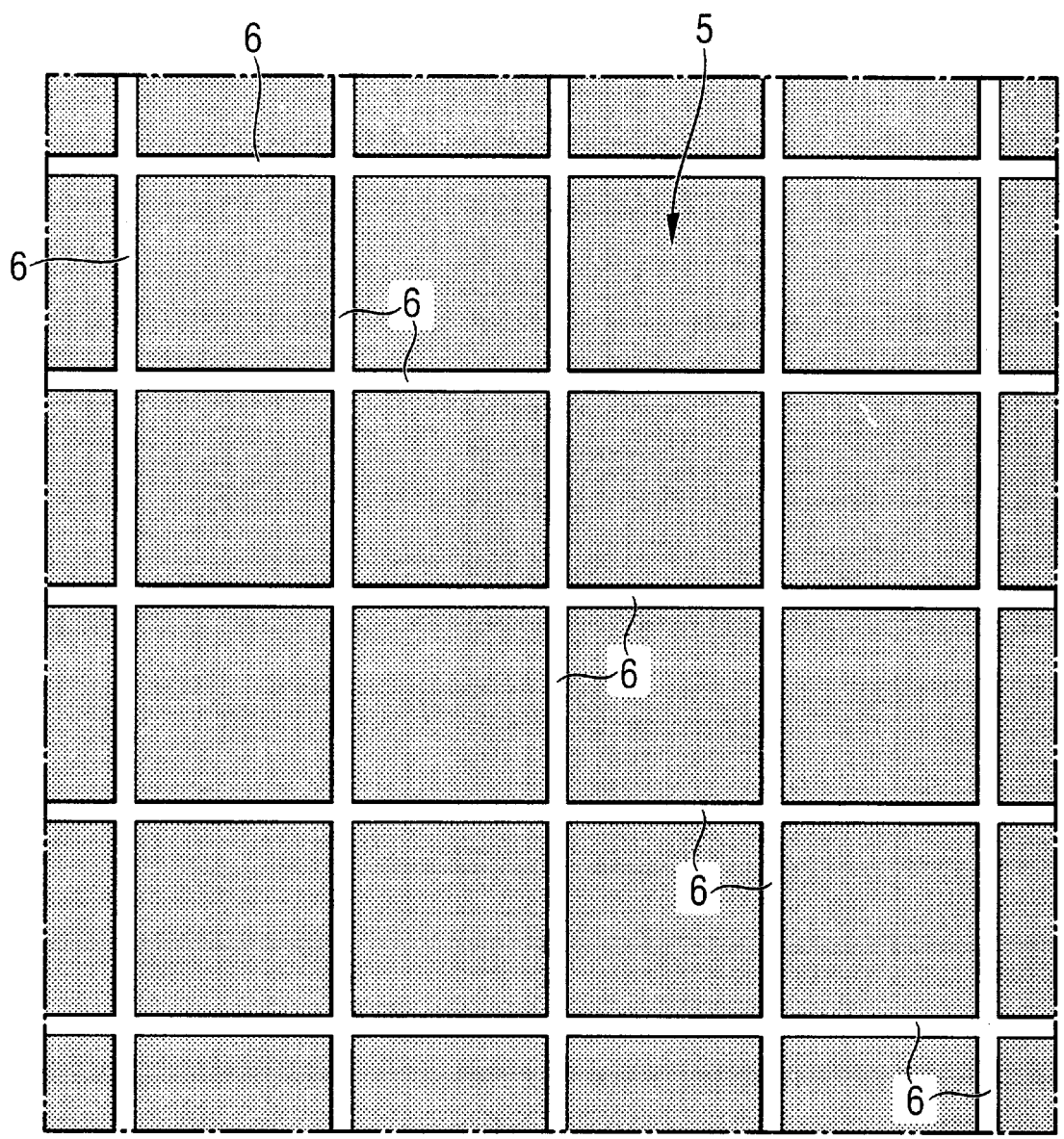
FIG. 2 shows a polishing cloth in which channels are formed in accordance with the invention.

The exchange of materials is also promoted by a polishing cloth 5 as shown in FIG. 2, with a surface which is interrupted by channels 6 for removing polishing abrasive, polishing auxiliaries and reaction products. Moreover, it is preferable for both polishing plates to be covered with polishing cloths of this type.

Furthermore, it is advantageous to observe certain process parameters during the double-side polishing. For example, the pH of the polishing abrasive should lie in a range from pH 8.5 to pH 12.5, particularly preferably in the range from pH 10.8 to pH 12.0, since the formation of hydrogen bubbles is relatively low in this range. The alkaline polishing abrasive used in step (b) preferably substantially comprises a suspension of silica particles and an inorganic and/or an organic base in ultrapure water.

A commercially available double-side polishing machine of suitable size can be used to carry out the double-side polishing. For cost reasons, it is desirable for a multiplicity of semiconductor wafers to be polished simultaneously. The polishing machine substantially comprises a lower polishing plate, which can rotate freely in a horizontal plane, and an upper polishing plate, which can rotate freely in a horizontal plane. Both of these plates are covered with in each case one polishing cloth, and the machine allows abrasive polishing of the semiconductor wafers on both sides with the polishing abrasive being supplied continuously.

The removal of material which is thus brought about by chemo-mechanical means preferably corresponds to a reduction in the thickness of the semiconductor wafer by 2 to 100 μm. The polishing abrasive is preferably supplied from a closed distributor system, particularly preferably with the aid of a controllable forced feed. This means that at any point in time and at any location on its surface, the semiconductor wafer comes into contact with equally concentrated chemically and mechanically active substances, so that the abrasion of material becomes more uniform.

It is also preferable for the semiconductor wafer during polishing to be exposed to a temperature which is at most in the range from 20° C. to 60° C., particularly preferably from 20° C. to 45° C. This is because at higher temperatures there is a greater evolution of hydrogen bubbles and these bubbles stick more strongly to the surface of the semiconductor wafer. When selecting the polishing-abrasive temperature, it should be taken into account that factors such as the frictional heat which is liberated during the polishing and the polishing plate temperature contribute to the temperature to which the semiconductor wafer is exposed.

After the double-side polishing (b) has ended, the chemically highly reactive hydrophobic wafer surface has to be separated from the polishing abrasive using a stopping agent. Conventional stopping agents are aqueous solutions, for example those which contain relatively long-chain alcohols, such as n-butanol. It has been found that the ability of hydrogen bubbles to adhere to the edge of the semiconductor wafer is lower if the stopping agent contains an alkaline surfactant. Therefore, it is particularly preferable to use a stopping agent which contains a surfactant of this type, preferably in a concentration from 0.01% to 1% by weight, particularly preferably 0.01% to 0.05% by weight.

An example of a particularly effective surface-active substance is the alkylphenol polyglycol ether which is marketed under the name Intrasol NP9 by Stockhausen GmbH (Germany) and bears the CAS number 9016-45-9. Another example is a mixture of anionic and nonionic surfactants, pyrophosphate and alkalies which is produced under the name Puratron by ICB GmbH (Germany). By contrast, the use of acidic surfactants in the stopping agent is less preferable. This is because in this case there is a risk of the silica contained in the polishing abrasive and possibly in the stopping agent being precipitated out and of the freshly polished surface of the semiconductor wafer being scratched by the silica.

While the stopping agent is being supplied, the polishing machine remains closed, so that the stopping agent between the rotating polishing plates simultaneously acts on the front surface, the back surface and the edge of the semiconductor wafer. There is no temporary exposure of the reactive wafer surface to atmospheric oxygen. The stopping agent, in the same way as previously the polishing abrasive, is preferably supplied from a closed distributor system, particularly preferably with the aid of a controllable forced feed. This promotes the rapid displacement of the polishing abrasive and ensures that at any time and at any location on its surface, the semiconductor wafer comes into contact with equally concentrated active substances.

After the stopping agent has been supplied in accordance with step (c), the upper polishing plate of the double-side polishing machine is lifted up and pivoted away. The semiconductor wafers can be removed manually using gloved fingers or by means of a manually guided vacuum suction device or an automatic unloading device. The semiconductor wafers are preferably transferred into an aqueous bath.

Accordingly, while a few embodiments of the present invention have been shown and described, it is to be understood that many changes and modifications may be made thereunto without departing from the spirit and scope of the invention as defined in the appended claims.

What is claimed is:

1. A process for producing a semiconductor wafer with a front surface and a back surface, in which the semiconductor wafer is subjected to two-sided polishing, which comprises the following temporal sequence of steps:

(a) producing a hydrophobic surface on the semiconductor wafer by treating the semiconductor wafer with an aqueous HF solution;

(b) simultaneous polishing of the front surface and the back surface of the semiconductor wafer with a surface which has been rendered hydrophobic, with an alkaline polishing abrasive being continuously supplied between two rotating upper and lower polishing plates, which are both covered with a polishing cloth, the pH of the polishing abrasive being from pH 8.5 to pH 12.5;

(c) after an intended polishing abrasion has been reached, supplying a stopping agent to the semiconductor wafer; and (d) removing the semiconductor wafer from the polishing plates.

2. The process as claimed in claim 1, wherein the semiconductor wafer lies in a cutout in a carrier during steps (b) and (c), and the cutout in the carrier is lined with a shaped part which is made from plastic; and said shaped part separating a plurality of empty spaces between the semiconductor wafer and the carrier from one another.

3. The process as claimed in claim 1, wherein polishing is carried out using polishing cloths;

said polishing cloths having channels made which serve to promote the exchange of polishing abrasive, polishing auxiliaries and reaction products.

4. The process as claimed in claim 1, wherein the alkaline polishing abrasive used in step (b) substantially comprises a suspension of silicon dioxide particles and a base selected from the group consisting of an inorganic base, an organic base, and mixtures thereof in ultrapure water.

5. The process as claimed in claim 1, wherein step (b) reduces the thickness of the semiconductor wafer by 2 to 100 µm.

6. The process as claimed in claim 1, wherein the stopping agent contains an alkaline surfactant.

7. The process as claimed in claim 1, wherein the polishing abrasive and the stopping agent are supplied from a closed distributor system.

8. The process as claimed in claim 1, comprising exposing the semiconductor wafer to a temperature of from 20° C. to 60° C. during steps (b) and (c).

9. The process as claimed in claim 7, wherein the polishing abrasive and the stopping agent are supplied from a closed distributor system, with the aid of a controllable forced feed.

* * * * *